United States Patent
Berkeman et al.

(10) Patent No.: US 8,378,861 B2
(45) Date of Patent: Feb. 19, 2013

(54) STORAGE OF PROBABILITY VALUES FOR CONTEXTS USED IN ARITHMETIC CODING

(75) Inventors: Anders Berkeman, Lund (SE); Dominic Hugo Symes, Cambridge (GB)

(73) Assignee: ARM Limited, Cambridge (GB)

( * ) Notice: Subject to any disclaimer, the term of this patent is extended or adjusted under 35 U.S.C. 154(b) by 204 days.

(21) Appl. No.: 12/926,601

(22) Filed: Nov. 29, 2010

(65) Prior Publication Data

US 2012/0133533 A1 May 31, 2012

(51) Int. Cl.
*H03M 7/00* (2006.01)

(52) U.S. Cl. .......................... 341/107; 341/106; 341/67

(58) Field of Classification Search ................. 341/107, 341/106, 67
See application file for complete search history.

(56) References Cited

U.S. PATENT DOCUMENTS

| | | | | |
|---|---|---|---|---|
| 5,736,947 | A * | 4/1998 | Imanaka | 341/107 |
| 5,809,176 | A * | 9/1998 | Yajima | 382/247 |
| 6,025,932 | A * | 2/2000 | Imanaka | 382/238 |
| 7,586,425 | B2 * | 9/2009 | Ridge et al. | 341/67 |
| 7,830,284 | B2 * | 11/2010 | Kawakami | 341/107 |
| 2002/0107669 | A1 * | 8/2002 | Chen | 702/189 |
| 2006/0017591 | A1 * | 1/2006 | Bossen | 341/50 |
| 2007/0110153 | A1 * | 5/2007 | Cho et al. | 375/240.12 |
| 2009/0304075 | A1 * | 12/2009 | Ogura et al. | 375/240.12 |
| 2010/0259427 | A1 * | 10/2010 | Otsuka | 341/107 |

OTHER PUBLICATIONS

Yu et al., "A High Performance CABAC Decoding Architecture", *IEEE*, No Date, 9 pages.

Son et al., Prediction-based Real-time CABAC Decoder for High Definition H.263/AVC, *IEEE*, 2008, pp. 33-36.

Kim et al, "Parallel Decoding of Context-based Adaptive Binary Arithmetic Codes Based on Most Probable Symbol Prediction", *IEICE Transaction on Information & Systems*, Jan. 2005, pp. 1-4.

Marpe et al., "Context-Based Adaptive Binary Arithmetic Coding in the H.264/AVC Video Compression Standard", *IEEE Transactions on Circuits & Systems for Video Technology*, vol. 13, No. 7, Jul. 2003, pp. 620-636.

Zhang et al., "Variable-Bin-Rate CABAC Engine for H.264/AVC High Definition Real-Time Decoding", *IEEE*, No Date, 10 pages.

\* cited by examiner

*Primary Examiner* — Jean B JeanGlaude

(74) *Attorney, Agent, or Firm* — Nixon & Vanderhye P.C.

(57) ABSTRACT

Arithmetic coding utilizes probability values associated with contexts and context indexed values. The probability values are stored within a random access memory 6 from where they are fetched to a cache memory 8 before being supplied to an arithmetic encoder and decoder 4. The context indexed values used are mapped to the plurality of contexts employed such that context indexed values used to process data values close by in a position within the stream of data values being processed have a greater statistical likelihood of sharing a group of contexts than context values used to process data values far away in position within the stream of data values. Thus, a group of contexts for which the probability values are fetched together into the cache memory 8 will have an increased statistical likelihood of being used together in close proximity in processing the stream of data values. This reduces the number of cache flush operations and cache line fill operations.

17 Claims, 4 Drawing Sheets

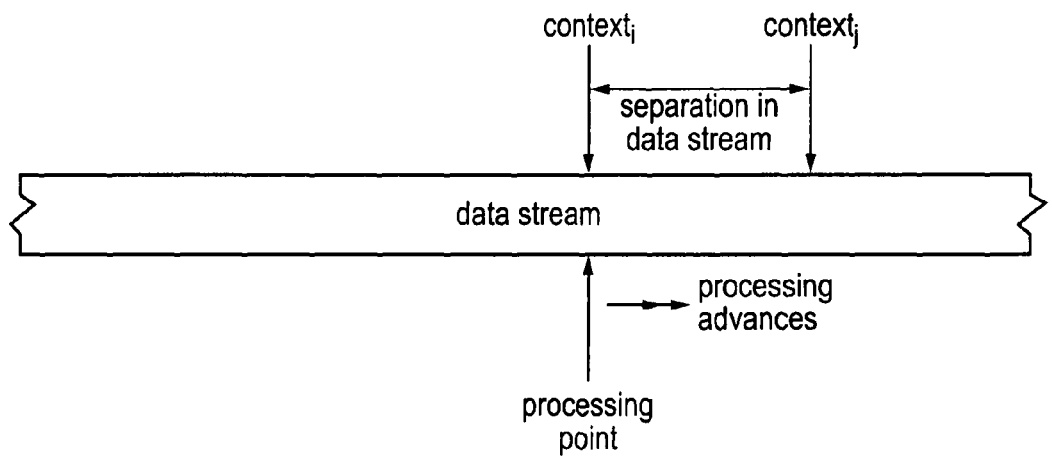
FIG. 2
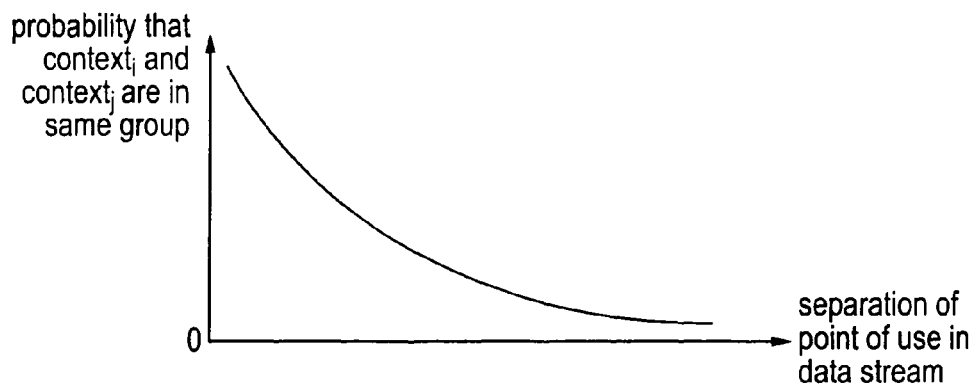
FIG. 3
FIG. 4

| MB (x-2)(y-1) | MB (x-1)(y-1) | MB* x(y-1) | MB (x+1)(y-1) | MB (x+2)(y-1) | ... |
|---|---|---|---|---|---|
| MB (x-2)y | MB* (x-1)y | MB# xy | | | |

\# = macro block being processed
∗ => context of # dependant upon MB∗

STORAGE OF PROBABILITY VALUES FOR CONTEXTS USED IN ARITHMETIC CODING

BACKGROUND OF THE INVENTION

1. Field of the Invention

This invention relates to the field of data processing systems. More particularly, this invention relates to the field of data processing systems for performing arithmetic coding.

2. Description of the Prior Art

It is known to provide data processing systems which perform arithmetic coding, both in the form of encoding and decoding. When performing arithmetic coding, one or more probability values are accessed in dependence upon a current context of the processing as each portion of the data stream is processed. One known form of arithmetic coding is context adaptive binary arithmetic coding of the type used in the H.264 video data coding standard.

It is desirable that systems using arithmetic coding should have a low cost and a low power consumption. A problem in this regard is the volume of probability data that is associated with a large number of contexts used during arithmetic coding. For example, when performing arithmetic coding in accordance with the H.264 Standard there may be 460 contexts each with an associated probability value which must be rapidly available for reading and writing. One known technique for storing the probability data associated with the different contexts is to use special purpose registers with each register storing a probability value associated with its own context value. A disadvantage of this approach is that the large number of registers necessary to provide such high speed access consume a disadvantageously large circuit area and consume a disadvantageously large amount of power.

Another possible approach is to store the probability data for the different contexts within a random access memory. Random access memories are typically dense storage structures consuming relatively little circuit area and power. However, a disadvantage of this approach is that the speed of access for reading and writing the probability values within the random access memory may be too low to support the high coding and decoding rates required.

SUMMARY OF THE INVENTION

Viewed from one aspect the present invention provides an apparatus for processing data comprising:

processing circuitry configured to perform processing using arithmetic coding, said arithmetic coding transforming between a stream of data values and a stream of coded data values and using a plurality of contexts, each of said plurality of contexts having a context index value and one or more associated probability values each indicating for a current context reached in said stream of data values a probability that a next data value within said stream will have a predicted value associated with that probability;

a memory configured to store said one or more probability values for said plurality of contexts; and a cache memory coupled to said processing circuitry and to said memory and configured to cache from said memory said one or more probability values for each of a group of contexts from within said plurality of contexts and to be addressed for access by said processing circuitry with a current context index value associated with said current context; wherein at least some of said context index values are mapped to said plurality of contexts such that context values used to process data values close by in position within said stream of data values have a greater statistical likelihood of sharing a group of contexts than context values used to process data values far away in position within said stream of data values.

The present technique recognises that a cache memory for storing the probability values may be efficiently used if the context index values (or at least the most frequently used and/or performance critical contexts) are mapped to form groups such that context index values used to process data values close by in position with the stream of data have a greater statistical likelihood of sharing a group than context values used to process data values far away in position within the stream of data values. The technique recognises that in practice the probability values of different context index values are not accessed randomly and that there is a correlation between the next context index value to access and the current index value. This correlation can be used to define a mapping between the context index values and the context they represent such that when the probability values for a group of context index values are fetched into the cache memory, then there is a high likelihood that repeated accesses will be made to the probability values of that group before that group is flushed from the cache memory back to the memory storing all of the probability values. If the context index values are not mapped to the plurality of contexts in accordance with the present technique, then there is a disadvantageous amount of cache line fetching and cache line flushing which renders the caching of the probability values from the memory less efficient and potentially counter-productive.

It will be appreciated that arithmetic coding in accordance with the present techniques may be used both to perform arithmetic encoding and arithmetic decoding. Separate hardware may be provided to perform arithmetic encoding and arithmetic decoding, or in some embodiments common hardware may perform both arithmetic encoding and arithmetic decoding depending upon its mode of operation.

Whilst the present technique may be used with arithmetic coding generally, it is useful in the field of binary arithmetic coding when each of the plurality of contexts has one associated probability value.

While the present technique is useful in embodiments in which the probability values only need to be read, the present technique may also be used when the arithmetic coding is context adaptive arithmetic coding and the processing circuitry both reads probability values from the cache memory and writes updated probability values to the cache memory.

It will be appreciated that the cache memory itself may have a variety of different forms. One form suited for the present use is where the cache memory is a single line cache memory configured to store a single line of probability values read from the memory and where the group of contexts correspond to a single cache line of probability values.

It will be appreciated that the memory storing the full set of probability values for all of the plurality of contexts can have a variety of different forms. In some embodiments the memory is a random access memory.

Random access memories are typically dense and power efficient. Furthermore, random access memories are well suited to convenient initialization under software control to store the one or more probability values for each of the plurality of contexts.

Whilst the present technique may be used in any form of arithmetic coding, it is well suited to use in situations where the stream of data values define video data, particularly video data in accordance with the H.264 video coding standard due to the high data rates which need to be supported and the requirement for low cost and low power consumption devices.

In the context of the H.264 video coding standard, the context index values used to access the cache memory are re-ordered relative to the context indexed values of the H.264 standard so as to take account of the statistical likelihood of which context values will be used following a current context value.

When the stream of data values being processed corresponds to a raster scanned image, then the context used at a given point within the image may be dependent upon one or more data values adjacent in the raster direction and perpendicular to the raster direction. In such embodiments, the data values at the adjacent preceding points in the raster direction and perpendicular to the raster direction may be respectively stored within a first register and a second register for convenient high speed access by the processing circuitry. In order to facilitate the reading and writing of the first register and the second register, these may be configured such that they are independently accessed.

In some embodiments, the alignment of context index values with the addressing mechanisms of the cache memory may be facilitated when one or more of the context index values are left unused such that groups of index values to be cached together are aligned with the corresponding storage locations within the memory. Thus, as cache lines are fetched a line at a time from the memory, aligning the groups within the memory will ensure that the group is fetched together to the cache memory and stored together within the cache memory.

Another use of unused context index values subsequent to the mapping of context index values to the plurality of contexts is that an access to a context value not mapped to a context and not stored within the cache memory can be used to trigger a write back to the memory of the probability values currently stored within the cache memory as this is flushed from the cache memory while any change made to the probability value stored at the location associated with the unused context index value will not have any harmful affect as this probability value will not be used in real processing.

Viewed from another aspect the present invention provides an apparatus for processing data comprising:

processing means for performing processing using arithmetic coding, said arithmetic coding transforming between a stream of data values and a stream of coded data values and using a plurality of contexts, each of said plurality of contexts having a context index value and one or more associated probability values each indicating for a current context reached in said stream of data values a probability that a next data value within said stream will have a predicted value associated with that probability;

memory means for storing said one or more probability values for said plurality of contexts; and cache memory means, coupled to said processing means and to said memory means, for caching from said memory means said one or more probability values for each of a group of contexts from within said plurality of contexts and to be addressed for access by said processing means with a current context index value associated with said current context; wherein at least some of said context index values are mapped to said plurality of contexts such that context values used to process data values close by in position within said stream of data values have a greater statistical likelihood of sharing a group of contexts than context values used to process data values far away in position within said stream of data values.

Viewed from a further aspect the present invention provides a method of processing data comprising the steps of:

performing processing using arithmetic coding, said arithmetic coding transforming between a stream of data values and a stream of coded data values and using a plurality of contexts, each of said plurality of contexts having a context index value and one or more associated probability values each indicating for a current context reached in said stream of data values a probability that a next data value within said stream will have a predicted value associated with that probability;

storing within a memory said one or more probability values for said plurality of contexts; and caching from said memory said one or more probability values for each of a group of contexts from within said plurality of contexts and to be addressed for access with a current context index value associated with said current context; wherein at least some of said context index values are mapped to said plurality of contexts such that context values used to process data values close by in position within said stream of data values have a greater statistical likelihood of sharing a group of contexts than context values used to process data values far away in position within said stream of data values.

A further aspect of the present invention is the method of generating an initialisation table for storing into the random access memory under software control. This may be achieved by receiving a standard initialisation table of initial probability values associated with the plurality of context and indexed with standard context index values, receiving data defining permutation to be applied to the context indexed values and then generating an initialisation table for storing in the random access memory in dependence upon the standard initialisation table and the data defining the permutation.

The above, and other objects, features and advantages of this invention will be apparent from the following detailed description of illustrative embodiments which is to be read in connection with the accompanying drawings.

BRIEF DESCRIPTION OF THE DRAWINGS

FIG. 2 schematically illustrates a matrix representing the probability that a context i is followed by a context j;

FIG. 3 schematically illustrates the processing by arithmetic coding of a stream of data values and how context i is followed in use by context j;

FIG. 4 schematically illustrates how the probability that context i and context j are in the same group varies as the separation of the point of use of these contexts within the stream of data values increases;

DESCRIPTION OF THE EMBODIMENTS

Figure 1:
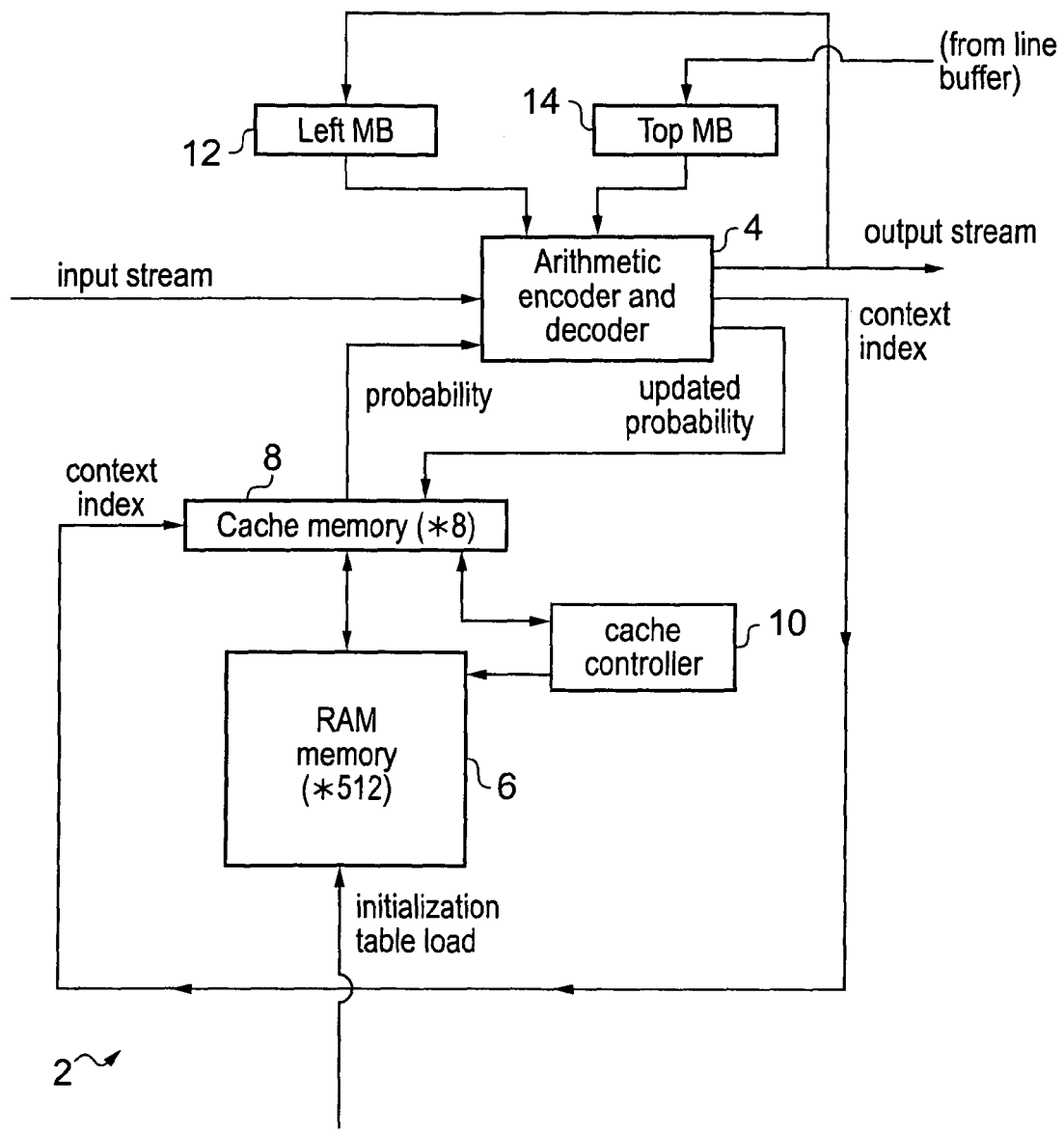
FIG. 1 schematically illustrates an arithmetic coding apparatus.

FIG. 1 schematically illustrates an apparatus 2 for performing arithmetic encoding and decoding. Processing circuitry in the form of an arithmetic encoder and decoder 4 receives an input stream of data values and generates an output stream of data values. When encoding, the input stream will be uncompressed data values and the output stream will be arithmetic coded compressed data values. When decoding, the input stream will be arithmetic coded compressed data values and the output stream will be uncompressed data values. The arithmetic coding used is context adaptive binary arithmetic coding. With such encoding there is a single probability value associated with each context. In the current example, the data stream being processed is a video image data stream in accordance with the H.264 video coding standard. In this standard there may be 460 contexts each of which has an associated probability value.

The probability values associated with the different contexts are stored within a memory 6 in the form of a random access memory having 512 storage locations. Each probability value is a 7-bit value with six bits indicating the probability as a fractional value between one and a half and the seventh bit indicating whether the probability refers to the next bit being a zero or a one. This type of encoding and decoding will be familiar to those in this technical field and will not be described further.

An address within the random access memory 6 corresponds to the context index value associated with the probability value stored at that address. The probability values are loaded into the random access memory 6 in the form of an initialization table and under software control. The probability values may also be read out of the random access memory 6 and saved elsewhere within the system under software control if it is desired to switch the processing being performed by the apparatus 2 to a different role and later returned to the processing of the data stream which was interrupted (and accordingly the adaptively altered probability values are required).

The probability values stored within the random access memory 6 are accessed via a cache memory 8. The cache memory 8 is a single line cache memory storing eight probability values. The cache memory 8 is addressed by a context index value for the current portion of the data stream being processed. The context index value is generated by the arithmetic encoding and decoder 4. The context index value is an address corresponding to the address within the random access memory 6 where the probability value associated with that context index value is stored.

A cache controller 10 serves to monitor whether a context index value misses or hits within the cache memory 8. If there is a cache miss, then a cache flush and cache line fill operation are triggered. The cache flush writes back the current content of the cache memory 8 into their corresponding locations within the random access memory 6. Thus, updated probability values which are produced during the context adaptive binary arithmetic coding operation are written back to the random access memory 6 where they are stored until they are next needed. A cache line fill operation reads eight probability values from the random access memory 6 into the cache memory 8.

The cache line fill operations and cache line flush operations are aligned with boundaries spaced apart by a difference of eight in the context index value. Thus, the groups of contexts and corresponding probability values contain eight elements and are matched to the length of the single line of the cache memory 8. The mapping used between context index values and context recognises this alignment constraint such that groups of contexts which are likely to occur proximal to each other within the processing of the data stream are mapped to the same group (i.e. between a pair of boundaries) such that once the cache memory 8 has been filled by a cache line fill operation it is statistically likely to be repeatedly accessed before a cache flush and a further cache line fill operation are required. This makes efficient use of the cache memory 8 and enables high speed processing by the arithmetic encoder and decoder 4 while the bulk of the probability values remain stored within the compact and energy efficient random access memory 6.

When operating in accordance with the H.264 video coding standard the context to be used is dependent upon the previous context, the data value processed and data derived from previously processed neighbouring macroblocks within the raster scanned image being processed. The data derived from neighbouring macroblocks are sourced from a macroblock position to the left (i.e. at an adjacent preceding point in the raster scan image measured parallel to the raster lines) and at a top position (i.e. at an adjacent preceding point in the raster scanned image measured perpendicular to the raster lines). These preceding data values may be stored within a first register 12 and a second register 14 from which they may be independently accessed both for reading and writing. The left macroblock data may be sourced directly from the arithmetic encoding and decoder 4. The top macroblock data may be sourced from a line buffer store each time the column position is changed when processing macroblocks. The data from the first register 12 and the second register 14 may be used to modify the context to be used after this has initially been determined based upon the current context and the data to be processed. The effect of neighbours upon context may be at a granularity of macroblocks or sub blocks (in which case neighbouring macroblocks only have an influence when processing a sub block at a left or top edge of the current macroblock).

As will be familiar to those in this technical field, the arithmetic encoding and decoder 4 processes a portion of the data stream in dependence upon its current context and using probability values associated with that current context. The probability value is then updated for the current context and a new context is determined dependent upon the processing which has been performed, the left macroblock data and the top macroblock data stored within the first register 12 and the second register 14. The new context corresponds to a new context index value which is supplied to the cache memory 8 to trigger the reading of the probability value for the next context index value. If a miss occurs within the cache memory 8, then the cache controller 10 triggers a cache flush followed by a cache line fill operation.

FIG. 2 schematically illustrates a matrix representing the possibility that a context i is followed by a context j. The probability values concerned may be determined by a statistical analysis of example data streams to be processed. The present technique exploits the realisation that there is a correlation between the current context being used and the likely next context to be used. Contexts tend to be used in particular sequences and the present technique exploits this by associating groups of sequential context index values with contexts likely to be used close to each other when processing the data stream such that they will be stored within the cache memory 8 together. This may be done for all contexts or in other embodiments the most frequently used and/or performance critical contexts.

FIG. 3 schematically illustrates the processing of a data stream. The arithmetic coding operates at a particular processing point at a particular time. This processing point advances through the data stream as the processing proceeds. At the current processing point, a context i is in use. At a later time, a context j is in use. The separation in the data stream between the points at which contexts i and j are used is illustrated.

FIG. 4 schematically illustrates the variation in the probability that context i and j are in the same group with the separation of the points of use within the data stream illustrated in FIG. 3. This variation in probability shows a steady decline. This variation in probability is that which is found when the mapping of the present technique has been used to assign context index values to the contexts such that contexts likely to be used close to each other have context index values that will be stored together within the cache memory 8 as part of the same group. It will be appreciated that the variation in FIG. 4 is merely schematic and in reality is likely to be less regular.

Figures 5, 6:
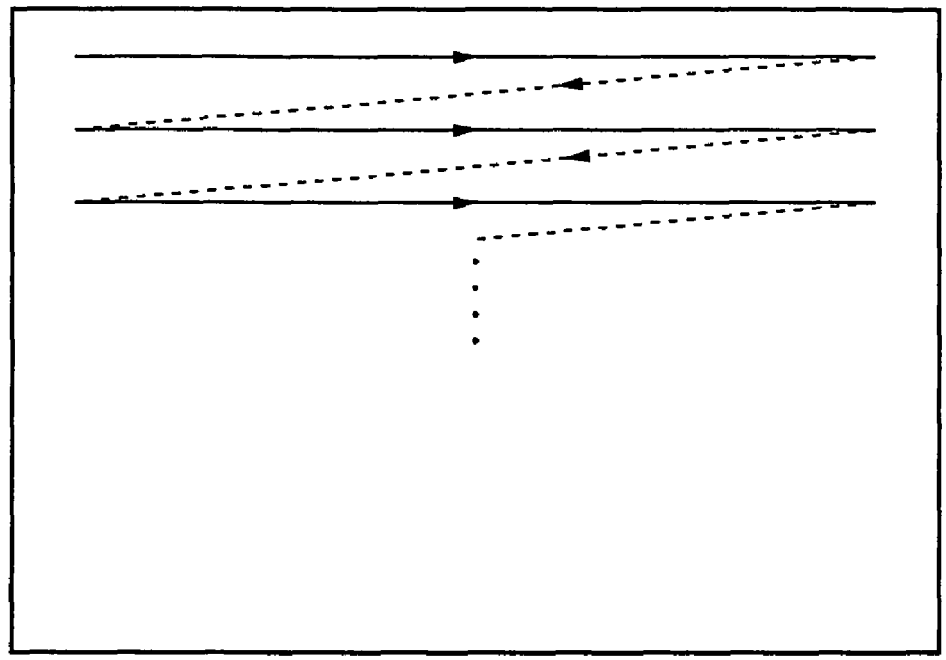
FIG. 5 illustrates a raster scanned video image.
FIG. 6 illustrates the dependence between macroblocks processed within the raster scanned image when determining a context to be used in arithmetic coding.

FIG. 5 schematically illustrates a video image signal having a raster scanned form. This arrangement of a video image will be familiar to those in this technical field. Each raster line is transmitted in turn.

FIG. 6 schematically illustrates two raster lines each formed of a sequence of macroblocks. When macroblock MBxy is being decoded, the context used in the arithmetic decoder is dependent upon data values associated with the preceding macroblock in the same raster line and the neighbouring macroblock in the preceding raster line as illustrated. The macroblock MB(x−1)y is at an adjacent preceding point in the raster scan image measured parallel to the raster lines. The macroblock MBx(y−1) is at an adjacent preceding point in the raster scan image measured perpendicular to the raster lines. Data corresponding to these two preceding macroblocks are stored within the first register 12 and the second register 14 of the arithmetic coding apparatus 2 of FIG. 1.

Figure 7:
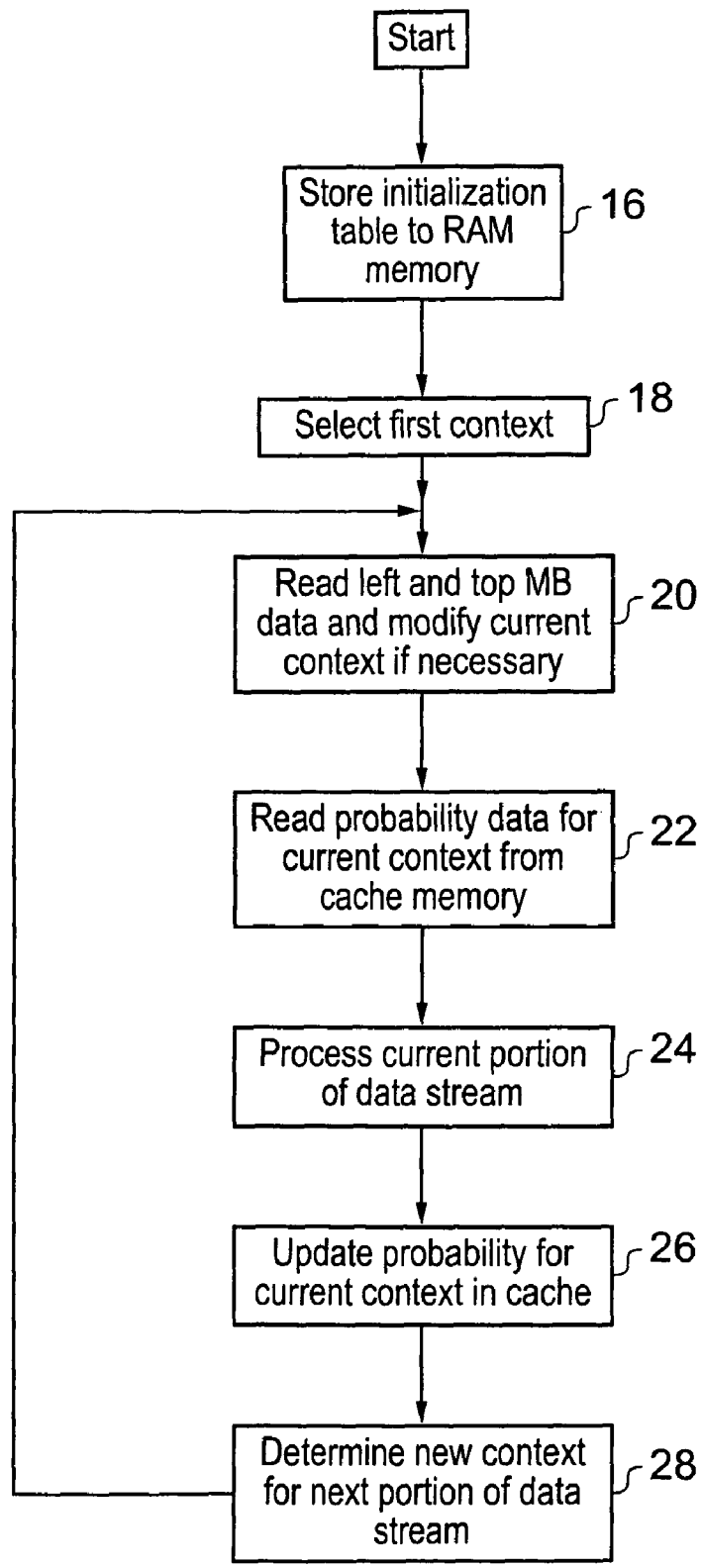
FIG. 7 is a flow diagram schematically illustrating the operation of the apparatus of FIG. 1.

FIG. 7 is a flow diagram schematically illustrating the operation of the cache memory 8 of FIG. 1. At step 16 an initialization table corresponding to the initial probability values is stored into the random access memory 6 under software control. At step 18 the first context is selected for decoding the stream of data values. This first context has a first context index value associated therewith. At step 20 the first register 12 and the second register 14 are read by the arithmetic encoding and decoder 4 and the current context is modified if necessary. At step 22 the context index value is used to address the cache memory 8. On the first access of the cache memory 8, there will be a cache miss. This is detected by the cache controller 10 and cache line fill operation will be performed to return probability values corresponding to a group of contexts with neighbouring context indexed values (in a sequence of eight consecutive context index values) to the cache memory 8. At step 22 the first register 12 and the second register 14 are read by the arithmetic encoding and decoder 4. At step 24 the arithmetic encoder and decoder 4 processes the current portion of the data stream in dependence upon the probability value read from the cache memory 8 for the current context. At step 26 the probability value read at step 22 is updated and written back into the cache memory 8. At step 28 a new context for the next portion of the data stream to be processed is determined by the arithmetic encoder and decoder 4 in dependence upon the contents of the first register 12 and the second register 14 as well as other factors. Processing is then returned to step 20.

An example of the mapping used between contexts and context index values in accordance with one example of the present technique is given in the following Table 1. In this table the addresses within the random access memory 6 are shown as the right hand entry. As an example, the first row in the table corresponds to addresses within the random access memory 6 represented by "0/4". The first four entries within a row are the context index values as specified within the normal H.264 video coding standard which correspond to the probability values which are stored within the addresses specified by the rightmost entry when subject to the mapping of the present technique. It will be seen that for the H.264 contexts numbered 0 to 84, these are stored in memory addresses within the random access memory 6 also corresponding to context index values 0 to 84. However, thereafter the mapping between the contexts and their context index values as used by the H.264 standard and those as used in the present technique vary considerably. For example, context indexed values 88, 89, 90, 91 corresponding to addresses 88, 89, 90, 91 within the random access memory 6 are used to store probability values corresponding to the context having contexts index values 227, 228, 229 and 230 within the H.264 standard.

As previously mentioned, the H.264 standard includes 460 contexts. The random access memory 6 includes 512 storage locations and accordingly supports 512 context indexed values which may be addressed. This allows for the inclusion of storage locations within the random access memory 6 and corresponding context indexed values which are unused in the actual arithmetic coding. These unused context indexed values may be used to provide better alignment between groups of contexts which are to have their probability values stored together within a cache line and the addresses by which the random access memory 6 and the cache memory 8 are addressed. Thus, it will be seen that context index values 186 to 191 are unused. This permits context index values 192 to 199 to contain the probability values corresponding to contexts 89, 90, 91, 92, 120, 181, 121 and 182 of the H.264 standard. Together these form a group of contexts with a high statistical likelihood of being used in close proximity within processing a stream of data values.

TABLE 1

```
static const int CONTEXT_PERMUTATION[512] = {
    // header probabilities
    0, 1, 2, 3, //        0/4
    4, 5, 6, 7, //        4/4
    8, 9, 10, 11, //      8/4
    12, 13, 14, 15, //    12/4
    16, 17, 18, 19, //    16/4
    20, 21, 22, 23, //    20/4
    24, 25, 26, 27, //    24/4
    28, 29, 30, 31, //    28/4
    32, 33, 34, 35, //    32/4
    36, 37, 38, 39, //    36/4
    40, 41, 42, 43, //    40/4
    44, 45, 46, 47, //    44/4
    48, 49, 50, 51, //    48/4
    52, 53, 54, 55, //    52/4
    56, 57, 58, 59, //    56/4
    60, 61, 62, 63, //    60/4
    64, 65, 66, 67, //    64/4
    68, 69, 70, 71, //    68/4
    72, 73, 74, 75, //    72/4
    76, 77, 78, 79, //    76/4
    80, 81, 82, 83, //    80/4
    84,399,400,401, //    84/4
    // calm0
    227,228,229,230, //   88/4
    231,232,233,234, //   92/4
    //calm1
    237,238,239,240, //   96/4
    241,242,243,244, //   100/4
    // calm2
    247,248,249,250, //   104/4
    251,252,253,254, //   108/4
    // calm3
    257,258,259,260, //   112/4
    261,262,263,264, //   116/4
    // calm4
    266,267,268,269, //   120/4
    270,271,272,273, //   124/4
    // calm5
    426,427,428,429, //   128/4
    430,431,432,433, //   132/4
    // calm0_8 calm0_9 calm1_8 calm1_9
    235,236,245,246, //   136/4
```

TABLE 1-continued

```
    // calm2__8 calm2__9 calm3__8
    255,256,265, 0, //          140/4
    // calm4__8 calm4__9 calm5__8 calm5__9
    274,275,434,435, //         144/4
    // reserved
    0, 0, 0, 0, //              148/4
    // cbf0 scf0/lscf0
    85, 86, 87, 88, //          152/4
    105,166,106,167, //         156/4
    107,168,108,169, //         160/4
    109,170,110,171, //         164/4
    111,172,112,173, //         168/4
    113,174,114,175, //         172/4
    115,176,116,177, //         176/4
    117,178,118,179, //         180/4
    119,180, 0, 0, //           184/4
    0, 0, 0, 0, //              188/4
    // cbf1 scf1/lscf1
    89, 90, 91, 92, //          192/4
    120,181,121,182, //         196/4
    122,183,123,184, //         200/4
    124,185,125,186, //         204/4
    126,187,127,188, //         208/4
    128,189,129,190, //         212/4
    130,191,131,192, //         216/4
    132,193,133,194, //         220/4
    // cbf2 scf2/lscf2 interleaved
    93, 94, 95, 96, //          224/4
    134,195,135,196, //         228/4
    136,197,137,198, //         232/4
    138,199,139,200, //         236/4
    140,201,141,202, //         240/4
    142,203,143,204, //         244/4
    144,205,145,206, //         248/4
    146,207,147,208, //         252/4
    148,209, 0, 0, //           256/4
    0, 0, 0, 0, //              260/4
    // cbf3 scf3/lscf3
    97, 98, 99,100, //          264/4
    149,210,150,211, //         268/4
    151,212, 0, 0, //           272/4
    0, 0, 0, 0, //              276/4
    // cbf4 scf4/lscf4
    101,102,103,104, //         280/4
    152,213,153,214, //         284/4
    154,215,155,216, //         288/4
    156,217,157,218, //         292/4
    158,219,159,220, //         296/4
    160,221,161,222, //         300/4
    162,223,163,224, //         304/4
    164,225,165,226, //         308/4
    // scf5/lscf5
    402,403,404,405, //         312/4
    406,407,408,409, //         316/4
    410,411,412,413, //         320/4
    414,415,416, 0, //          324/4
    417,418,419,420, //         328/4
    421,422,423,424, //         332/4
    425, 0, 0, 0, //            336/4
    0, 0, 0, 0, //              340/4
    // field scf0/lscf0
    277,338,278,339, //         344/4
    279,340,280,341, //         348/4
    281,342,282,343, //         352/4
    283,344,284,345, //         356/4
    285,346,286,347, //         360/4
    287,348,288,349, //         364/4
    289,350,290,351, //         368/4
    291,352, 0, 0, //           372/4
    // field scf1/lscf1
    292,353,293,354, //         376/4
    294,355,295,356, //         380/4
    296,357,297,358, //         384/4
    298,359,299,360, //         388/4
    300,361,301,362, //         392/4
    302,363,303,364, //         396/4
    304,365,305,366, //         400/4
    0, 0, 0, 0, //              404/4
    // field scf2/lscf2
    306,367,307,368, //         408/4
    308,369,309,370, //         412/4
    310,371,311,372, //         416/4
    312,373,313,374, //         420/4
    314,375,315,376, //         424/4
    316,377,317,378, //         428/4
    318,379,319,380, //         432/4
    320,381, 0, 0, //           436/4
    // field scf3/lscf3
    321,382,322,383, //         440/4
    323,384, 0, 0, //           444/4
    // field scf4/lscf4
    324,385,325,386, //         448/4
    326,387,327,388, //         452/4
    328,389,329,390, //         456/4
    330,391,331,392, //         460/4
    332,393,333,394, //         464/4
    334,395,335,396, //         468/4
    336,397,337,398, //         472/4
    0, 0, 0, 0, //              476/4
    // field scf5/lscf5
    436,437,438,439, //         480/4
    440,441,442,443, //         484/4
    444,445,446,447, //         488/4
    448,449,450, 0, //          492/4
    451,452,453,454, //         496/4
    455,456,457,458, //         500/4
    459, 0, 0, 0, //            504/4
    // term
    0, 0,276, 0 //              508/4
};
```

An example process to generate the mapping is as follows.

1. Modify a software H.264 decoder to log context indices on the fly.
2. Storing these addressing patterns for a set of "representative" movie clips.
3. Viewing the indices as states in a state machine, generate the probability matrix (see FIG. 2) for the corresponding Markov machine. The probability matrix is a matrix of transition probabilities. Entry (ij) is the probability that index j follows index i. This is also known as the probability matrix for a Markov chain.
4. Deriving the most probable paths through the machine, while manually forcing some indices to absolute memory addresses. This may be by starting from some known point (for example the residuals of a macroblock always start with a coded block flag) and reading the most probable chain following off the matrix. The chains may then be manually combined into a table as shown in Table 1.

In this fashion, context indices are reordered such that indices typically called in sequence will be stored in the same cache line with high probability.

Note that there are a large number of possible permutations, where some are better than others. Also, for a certain video clip, there is one subset of permutations that works the best. A global optimisation over many video clips is a trade-off.

If an unused context index value which is not stored within the cache memory 8 is generated by the arithmetic encoder and decoder 4, then this will cause a cache miss. The cache miss will trigger a cache flush and write back of the updated probability values stored within the cache memory 8 to the random access memory 6. Any update which takes place to the probability value stored at the storage location corresponding to the unused context index value will not cause a difficulty as this context index value is not used for any processing which will alter the output stream.

It will be appreciated that the apparatus of FIG. 1 may be used during both encoding and decoding. Context index values and probabilities are accessed during both encoding and decoding and accordingly the present technique is useful for embodiments which include either or both of an encoder and/or a decoder.

It will be appreciated that the example mapping given above is only one example of a mapping which may be used. It may be that for different video image streams better mappings may be achievable. Nevertheless, the mapping given above is useful in rendering the cache memory 8 more efficient by increasing the statistical likelihood of groups of contexts which will be used in proximity to each other being fetched together within a cache line into the cache memory 8.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An apparatus for processing data comprising:
    processing circuitry configured to perform processing using arithmetic coding, said arithmetic coding transforming between a stream of data values and a stream of coded data values and using a plurality of contexts, each of said plurality of contexts having a context index value and one or more associated probability values, said probability values each indicating, for a current context reached in said stream of data values, a probability that a next data value within said stream will have a predicted value associated with that probability;
    a probability value memory configured to store said one or more probability values for said plurality of contexts; and
    a cache memory, coupled to said processing circuitry and to said probability value memory, configured to cache from said probability value memory said one or more probability values for each of a group of contexts from within said plurality of contexts and to be addressed for access by said processing circuitry with a current context index value associated with said current context; wherein
    at least some of said context index values are mapped to said plurality of contexts such that context index values used to process data values close by in position within said stream of data values have a greater statistical likelihood of sharing a group of contexts than context index values used to process data values far away in position within said stream of data values.

2. The apparatus as claimed in claim 1, wherein said processing circuitry is configured to perform at least one of arithmetic encoding and arithmetic decoding.

3. The apparatus as claimed in claim 1, wherein said arithmetic coding is binary arithmetic coding and each of said plurality of contexts has one associated probability value.

4. The apparatus as claimed in claim 1, wherein said arithmetic coding is context adaptive arithmetic coding and said processing circuitry is configured to read probability values from said cache memory and to write updated probability values to said cache memory.

5. The apparatus as claimed in claim 1, wherein said cache memory is a single line cache memory configured to store a single line of probability values read from said probability value memory and said group of contexts correspond to said single line of probability values.

6. The apparatus as claimed in claim 1, wherein said probability value memory is a random access memory.

7. The apparatus as claimed in claim 1, wherein said probability value memory is initialised under software control to store said one or more probability values for said plurality of contexts.

8. The apparatus as claimed in claim 1, wherein said stream of data values defines video data.

9. The apparatus as claimed in claim 8, wherein said stream of data values is encoded in accordance with a H.264 video encoding standard and said context index values are re-ordered relative to context index values used in said H.264 video encoding standard.

10. The apparatus as claimed in claim 1, wherein said stream of data values corresponds to a raster scanned image formed of raster lines and a context used at a given point within said image is dependent upon one or more data values at an adjacent preceding point in said raster scanned image measured parallel to said raster lines and one or more data values at an adjacent preceding point in said raster scanned image measured perpendicular to said raster lines.

11. The apparatus as claimed in claim 10, comprising a first register configured to store said one or more data values at an adjacent preceding point in said raster scanned image measured parallel to said raster lines are stored within a first register and a second register configured to store said one or more data values at an adjacent preceding point in said raster scanned image measured perpendicular to said raster lines.

12. The apparatus as claimed in claim 11, wherein said processing circuitry is configured to independently access said first register and said second register.

13. The apparatus as claimed in claim 1, wherein said context index values are mapped to said plurality of contexts such that one or more of said context index values are unused so as to align groups of index values to be cached together within said cache memory with corresponding storage locations within said probability value memory.

14. The apparatus as claimed in claim 1, wherein said context index values are mapped to said plurality of contexts such that one or more of said context index values are unused, whereby an access to a context value not mapped to a context and not stored within said cache memory serves to trigger a write back to said probability value memory of said one or more probability values for each of said group of contexts currently stored within said cache memory.

15. The apparatus for processing data comprising:
    processing means for performing processing using arithmetic coding, said arithmetic coding transforming between a stream of data values and a stream of coded data values and using a plurality of contexts, each of said plurality of contexts having a context index value and one or more associated probability values, said probability values each indicating, for a current context reached in said stream of data values, a probability that a next data value within said stream will have a predicted value associated with that probability;
    probability value memory means for storing said one or more probability values for said plurality of contexts; and
    cache memory means, coupled to said processing means and to said probability value memory means, for caching from said probability value memory means said one or more probability values for each of a group of contexts from within said plurality of contexts and to be addressed for access by said processing means with a current context index value associated with said current context; wherein
    at least some of said context index values are mapped to said plurality of contexts such that context index values used to process data values close by in position within said stream of data values have a greater statistical likelihood of sharing a group of contexts than context index values used to process data values far away in position within said stream of data values.

16. A method of processing data comprising the steps of:

performing processing using arithmetic coding, said arithmetic coding transforming between a stream of data values and a stream of coded data values and using a plurality of contexts, each of said plurality of contexts having a context index value and one or more associated probability values, said probability values each indicating, for a current context reached in said stream of data values, a probability that a next data value within said stream will have a predicted value associated with that probability;

storing within a probability value memory said one or more probability values for said plurality of contexts; and caching in a cache memory from said probability value memory said one or more probability values for each of a group of contexts from within said plurality of contexts and to be addressed for access with a current context index value associated with said current context; wherein at least some of said context index values are mapped to said plurality of contexts such that context index values used to process data values close by in position within said stream of data values have a greater statistical likelihood of sharing a group of contexts than context index values used to process data values far away in position within said stream of data values.

17. The method of configuring an apparatus as claimed in claim 7, said method comprising the steps of:

receiving a standard initialization table of initial probability values associated with said plurality of contexts and indexed with standard context index values;

receiving data defining a permutation between said standard context index values and said context index values used to address said cache memory; and generating an initialization table for storing in said memory in dependence upon said standard initialization table and said data defining said permutation.

* * * * *